US008704333B2

(12) United States Patent
Phillips et al.

(10) Patent No.: US 8,704,333 B2
(45) Date of Patent: Apr. 22, 2014

(54) FUSE CHAMBERS ON A SUBSTRATE

(75) Inventors: Andrew Phillips, Corvallis, OR (US); Jeremy H. Donaldson, Corvallis, OR (US); Julie J. Cox, Albany, OR (US); Mark H. MacKenzie, Vancouver, WA (US); Christopher A. Leonard, Philomath, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 241 days.

(21) Appl. No.: 12/742,300

(22) PCT Filed: Dec. 19, 2007

(86) PCT No.: PCT/US2007/088179
§ 371 (c)(1), (2), (4) Date: May 11, 2010

(87) PCT Pub. No.: WO2009/078879
PCT Pub. Date: Jun. 25, 2009

(65) Prior Publication Data

US 2010/0283120 A1 Nov. 11, 2010

(51) Int. Cl.
*H01L 29/72* (2006.01)

(52) U.S. Cl.
USPC ............. 257/529; 257/E21.327; 257/E23.149

(58) Field of Classification Search
USPC ........................... 257/529, E21.327, E23.149
See application file for complete search history.

(56) References Cited

U.S. PATENT DOCUMENTS

| | | | | |
|---|---|---|---|---|
| 6,162,589 | A | 12/2000 | Chen et al. | |
| 7,226,149 | B2 | 6/2007 | Stout et al. | |
| 2002/0060350 | A1 | 5/2002 | Schulte et al. | |
| 2004/0223034 | A1 | 11/2004 | Feinn et al. | |
| 2005/0145982 | A1 | 7/2005 | Chavarria | |
| 2005/0245043 | A1 * | 11/2005 | Martin et al. | 438/424 |
| 2005/0259123 | A1 | 11/2005 | Rice et al. | |
| 2005/0270332 | A1 | 12/2005 | Strand et al. | |
| 2006/0066677 | A1 | 3/2006 | Hori | |
| 2006/0262161 | A1 | 11/2006 | Rice et al. | |
| 2007/0103501 | A1 | 5/2007 | Hatsui et al. | |
| 2007/0194371 | A1 | 8/2007 | Benjamin | |
| 2007/0245559 | A1 | 10/2007 | Feinn et al. | |
| 2007/0285459 | A1 * | 12/2007 | Hatsui et al. | 347/20 |
| 2009/0021338 | A1 * | 1/2009 | Kim et al. | 337/227 |

FOREIGN PATENT DOCUMENTS

EP 1680278 10/2007

OTHER PUBLICATIONS

"Using a SU8 primer layer method to control a wicked adhesive in fuse chambers", Research Disclosure Journal, ISSN 0374-4353. Aug. 2005. pp. 1-3. Research Disclosure Database No. 496053, Kenneth Mason Publications Ltd., The Book Barn, Westbourne, Hants. PO10 8RS. UK.

Supplementary European Search Report for Application No. EP07862050.7. Report issued Nov. 24, 2010, 3 pages.

* cited by examiner

*Primary Examiner* — Edward Wojciechowicz

(57) ABSTRACT

Embodiments of a system with first means for forming a chamber adjacent to a component formed on a substrate and a single orifice between the chamber and a first surface of the first means that is opposite a second surface of the first means adjacent to the substrate and second means for enclosing the chamber on at least a portion of the first surface that encompasses the single orifice are disclosed.

18 Claims, 6 Drawing Sheets

FUSE CHAMBERS ON A SUBSTRATE

BACKGROUND

An inkjet printing system, as one embodiment of a fluid ejection system, may include a printhead, an ink supply that provides liquid ink to the printhead, and an electronic controller that controls the printhead. The printhead, as one embodiment of a fluid ejection device, ejects ink drops through a plurality of orifices or nozzles.

A fluid ejection device in an inkjet printing system may include fuses as part of a programmable read-only memory (PROM). The fuses are used to store information during the manufacture or use of the device by blowing selected fuses. The blowing of fuses, however, can damage portions of a fluid ejection device. If undesirable fluidic or non-fluidic material comes into contact with a damaged portion near a blown fuse, the fuse may effectively become un-blown and thereby change the bit of information stored by the fuse. At the same time, materials disposed in close proximity to the fuse may affect the thermal or electrical environment of blowing the fuse.

DETAILED DESCRIPTION

In the following detailed description, reference is made to the accompanying drawings, which form a part hereof, and in which is shown by way of illustration specific embodiments in which the disclosed subject matter may be practiced. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

According to one embodiment, a layer of material forms a chamber adjacent to a component on a substrate. The layer of material includes a single orifice between the chamber and a top surface of the layer that is opposite of the bottom surface of the layer adjacent to the substrate. The orifice provides an access point for removing material from the layer to define the chamber. An encapsulation layer encloses the chamber by covering the orifice with an encapsulation material. The chamber provides a desired thermal and electrical environment for the component and the encapsulation layer prevents fluidic and non-fluidic materials from entering the chamber.

Figure 1:
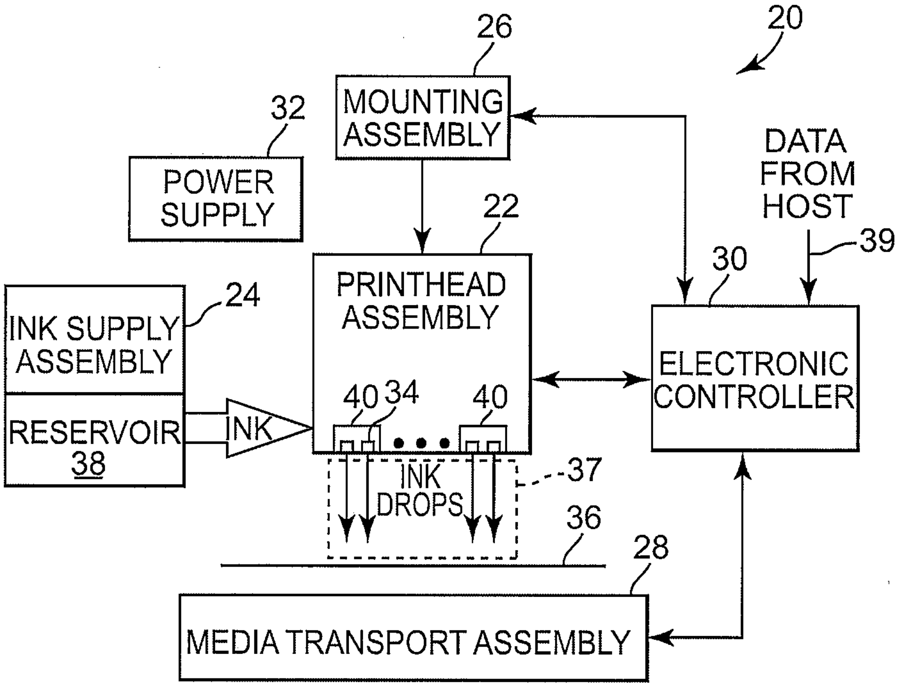
FIG. 1 is a block diagram illustrating one embodiment of an inkjet printing system.

FIG. 1 is a block diagram illustrating one embodiment of an inkjet printing system 20. Inkjet printing system 20 constitutes one embodiment of a fluid ejection system that includes a fluid ejection device, such as inkjet printhead assembly 22, and a fluid supply assembly, such as ink supply assembly 24. The inkjet printing system 20 also includes a mounting assembly 26, a media transport assembly 28, and an electronic controller 30. At least one power supply 32 provides power to the various electrical components of inkjet printing system 20.

In one embodiment, inkjet printhead assembly 22 includes at least one printhead or printhead die 40 that ejects drops of ink through a plurality of orifices or nozzles 34 toward a print medium 36 so as to print onto print medium 36. Printhead 40 is one embodiment of a fluid ejection device. Print medium 36 may be any type of suitable sheet material, such as paper, card stock, transparencies, Mylar, fabric, and the like. Typically, nozzles 34 are arranged in one or more columns or arrays such that properly sequenced ejection of ink from nozzles 34 causes characters, symbols, and/or other graphics or images to be printed upon print medium 36 as inkjet printhead assembly 22 and print medium 36 are moved relative to each other. While the following description refers to the ejection of ink from printhead assembly 22, it is understood that other liquids, fluids or flowable materials, including clear fluid, may be ejected from printhead assembly 22.

Ink supply assembly 24 as one embodiment of a fluid supply assembly provides ink to printhead assembly 22 and includes a reservoir 38 for storing ink. As such, ink flows from reservoir 38 to inkjet printhead assembly 22. Ink supply assembly 24 and inkjet printhead assembly 22 can form either a one-way ink delivery system or a recirculating ink delivery system. In a one-way ink delivery system, substantially all of the ink provided to inkjet printhead assembly 22 is consumed during printing. In a recirculating ink delivery system, only a portion of the ink provided to printhead assembly 22 is consumed during printing. As such, ink not consumed during printing is returned to ink supply assembly 24.

In one embodiment, inkjet printhead assembly 22 and ink supply assembly 24 are housed together in an inkjet cartridge or pen. The inkjet cartridge or pen is one embodiment of a fluid ejection device. In another embodiment, ink supply assembly 24 is separate from inkjet printhead assembly 22 and provides ink to inkjet printhead assembly 22 through an interface connection, such as a supply tube (not shown). In either embodiment, reservoir 38 of ink supply assembly 24 may be removed, replaced, and/or refilled. In one embodiment, where inkjet printhead assembly 22 and ink supply assembly 24 are housed together in an inkjet cartridge, reservoir 38 includes a local reservoir located within the cartridge and may also include a larger reservoir located separately from the cartridge. As such, the separate, larger reservoir serves to refill the local reservoir. Accordingly, the separate, larger reservoir and/or the local reservoir may be removed, replaced, and/or refilled.

Mounting assembly 26 positions inkjet printhead assembly 22 relative to media transport assembly 28 and media transport assembly 28 positions print medium 36 relative to inkjet printhead assembly 22. Thus, a print zone 37 is defined adjacent to nozzles 34 in an area between inkjet printhead assembly 22 and print medium 36. In one embodiment, inkjet printhead assembly 22 is a scanning type printhead assembly. As such, mounting assembly 26 includes a carriage (not shown) for moving inkjet printhead assembly 22 relative to media transport assembly 28 to scan print medium 36. In another embodiment, inkjet printhead assembly 22 is a non-scanning type printhead assembly. As such, mounting assembly 26 fixes inkjet printhead assembly 22 at a prescribed position relative to media transport assembly 28. Thus, media transport assembly 28 positions print medium 36 relative to inkjet printhead assembly 22.

Electronic controller or printer controller 30 typically includes a processor, firmware, and other electronics, or any combination thereof, for communicating with and controlling inkjet printhead assembly 22, mounting assembly 26, and media transport assembly 28. Electronic controller 30 receives data 39 from a host system, such as a computer, and usually includes memory for temporarily storing data 39. Typically, data 39 is sent to inkjet printing system 20 along an electronic, infrared, optical, or other information transfer path. Data 39 represents, for example, a document and/or file to be printed. As such, data 39 forms a print job for inkjet printing system 20 and includes one or more print job commands and/or command parameters.

In one embodiment, electronic controller 30 controls inkjet printhead assembly 22 for ejection of ink drops from nozzles 34. As such, electronic controller 30 defines a pattern of ejected ink drops that form characters, symbols, and/or other graphics or images on print medium 36. The pattern of ejected ink drops is determined by the print job commands and/or command parameters.

In one embodiment, inkjet printhead assembly 22 includes one printhead 40. In another embodiment, inkjet printhead assembly 22 is a wide-array or multi-head printhead assembly. In one wide-array embodiment, inkjet printhead assembly 22 includes a carrier, which carries printhead dies 40, provides electrical communication between printhead dies 40 and electronic controller 30, and provides fluidic communication between printhead dies 40 and ink supply assembly 24.

Figure 2:
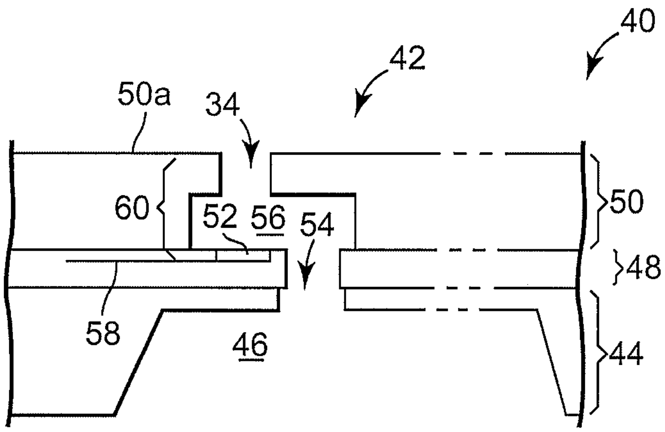
FIG. 2 is a diagram illustrating a portion of one embodiment of a printhead die.

FIG. 2 is a diagram illustrating a portion of one embodiment of a printhead die 40. The printhead die 40 includes an array of printing or fluid ejecting elements 42. Printing elements 42 are formed on a substrate 44, which has an ink feed slot 46 formed therein. As such, ink feed slot 46 provides a supply of liquid ink to printing elements 42. Ink feed slot 46 is one embodiment of a fluid feed source. Other embodiments of fluid feed sources include but are not limited to corresponding individual ink feed holes feeding corresponding vaporization chambers and multiple shorter ink feed trenches that each feed corresponding groups of fluid ejecting elements. A thin-film structure 48 has an ink feed channel 54 formed therein which communicates with ink feed slot 46 formed in substrate 44. A layer 50 has a top face 50*a* and a nozzle opening 34 formed in top face 50*a*. Layer 50 also has a nozzle chamber or vaporization chamber 56 formed therein which communicates with nozzle opening 34 and ink feed channel 54 of thin-film structure 48. A firing resistor 52 is positioned within vaporization chamber 56 and leads 58 electrically couple firing resistor 52 to circuitry controlling the application of electrical current through selected firing resistors. A drop generator 60 as referred to herein includes firing resistor 52, nozzle chamber or vaporization chamber 56 and nozzle opening 34.

During printing, ink flows from ink feed slot 46 to vaporization chamber 56 via ink feed channel 54. Nozzle opening 34 is operatively associated with firing resistor 52 such that droplets of ink within vaporization chamber 56 are ejected through nozzle opening 34 (e.g., substantially normal to the plane of firing resistor 52) and toward print medium 36 upon energization of firing resistor 52.

Example embodiments of printhead dies 40 include a thermal printhead, a piezoelectric printhead, an electrostatic printhead, or any other type of fluid ejection device known in the art that can be integrated into a multi-layer structure. Substrate 44 is formed, for example, of silicon, glass, ceramic, or a stable polymer and thin-film structure 48 is formed to include one or more passivation or insulation layers of silicon dioxide, silicon carbide, silicon nitride, tantalum, polysilicon glass, or other suitable material. Thin-film structure 48 also includes at least one conductive layer, which defines firing resistor 52 and leads 58. The conductive layer is made, for example, to include aluminum, gold, tantalum, tantalum-aluminum, or other metal or metal alloy.

In one embodiment, layer 50 comprises a photoimageable epoxy resin, for example, an epoxy referred to as SU8, marketed by Micro-Chem, Newton, Mass. Exemplary techniques for fabricating layer 50 with SU8 or other polymers are described in detail in U.S. Pat. No. 7,226,149, which is herein incorporated by reference. Other suitable materials, however, can be employed to form layer 50.

Figure 3:
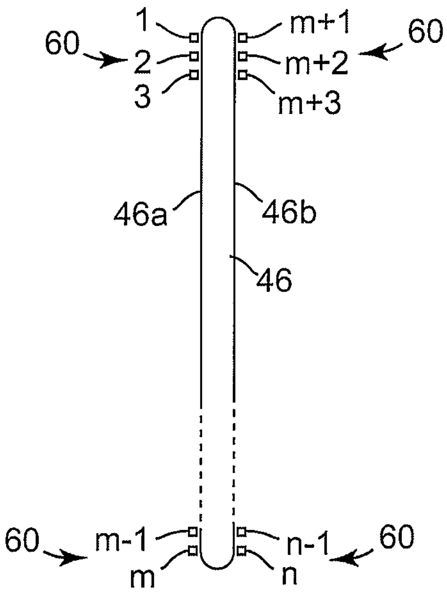
FIG. 3 is a diagram illustrating a layout of drop generators located along an ink feed slot in one embodiment of a printhead die.

FIG. 3 is a diagram illustrating drop generators 60 located along ink feed slot 46 in one embodiment of printhead die 40. Ink feed slot 46 includes opposing ink feed slot sides 46*a* and 46*b*. Drop generators 60 are disposed along each of the opposing ink feed slot sides 46*a* and 46*b*. A total of n drop generators 60 are located along ink feed slot 46, with m drop generators 60 located along ink feed slot side 46*a*, and n-m drop generators 60 located along ink feed slot side 46*b*. In one embodiment, n equals 200 drop generators 60 located along ink feed slot 46 and m equals 100 drop generators 60 located along each of the opposing ink feed slot sides 46*a* and 46*b*. In other embodiments, any suitable number of drop generators 60 can be disposed along ink feed slot 46.

Ink feed slot 46 provides ink to each of the n drop generators 60 disposed along ink feed slot 46. Each of the n drop generators 60 includes a firing resistor 52, a vaporization chamber 56 and a nozzle 34. Each of the n vaporization chambers 56 is fluidically coupled to ink feed slot 46 through at least one ink feed channel 54. The firing resistors 52 of drop generators 60 are energized in a controlled sequence to eject fluid from vaporization chambers 56 and through nozzles 34 to print an image on print medium 36.

Figure 4A:
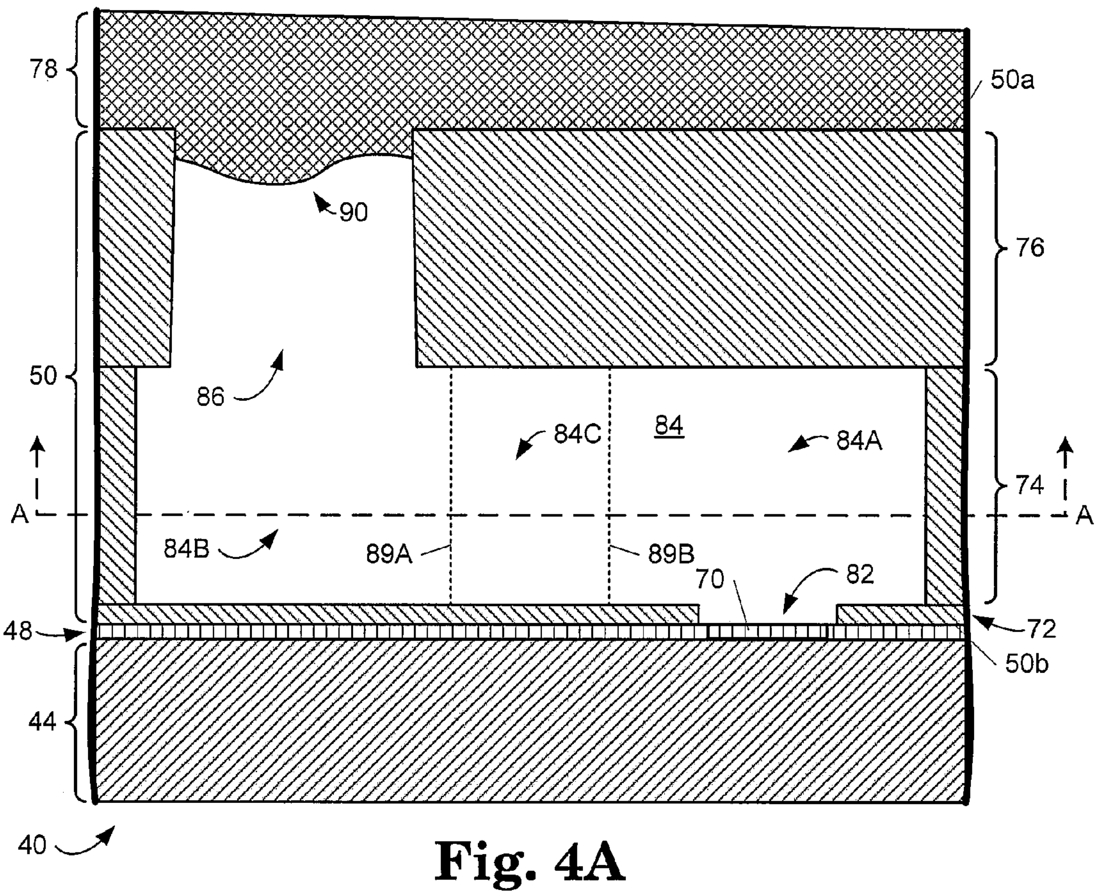
FIGS. 4A-4B are diagrams illustrating side and top cross-section views of one embodiment of a portion of a printhead die.
Figure 4B:
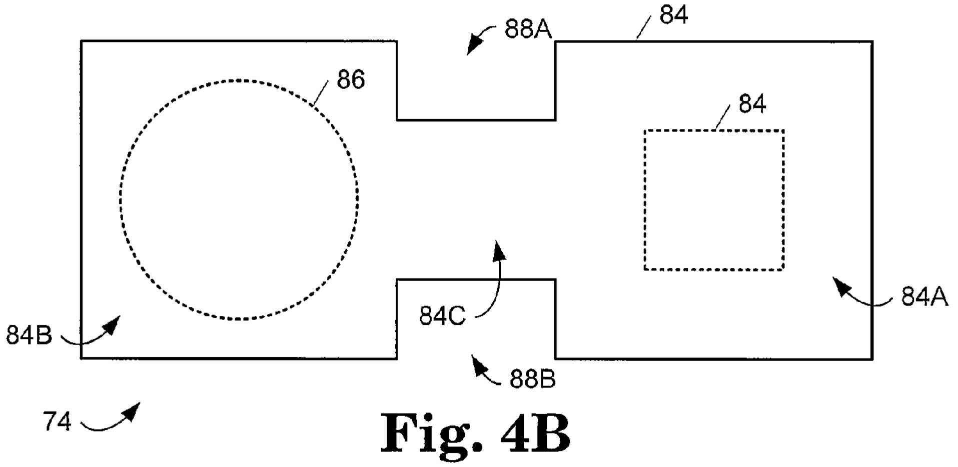

FIGS. 4A-4B are diagrams illustrating side and top cross-section views, respectively, of one embodiment of a portion of printhead die 40. Printhead die 40 includes any suitable number of programmable fuses 70 that are formed in a conductive layer in thin film layer 48 on substrate 40. Leads (not shown) connect fuse 70 to bond pads (not shown) of printhead die 40 to provide electrically conductive paths from printhead assembly 22 to fuses. Fuses 70 function as ID bits of a programmable read-only memory (PROM). The PROM may be programmed during the manufacturing process or in normal operation of printhead die 40 by blowing or burning selected fuses 70 so that each fuse 70 stores a single bit of information. Each fuse 70 may be blown by applying a sufficient voltage across the fuse 70 for a sufficient time period to cause the fuse 70 to change from having a low resistance to having a high resistance. The low and high resistances of fuses 70 represent different logic levels. For example, a blown or burned fuse 70 may represent a logic level of one and an unblown or unburned fuse 70 may represent a logic level of zero or vice versa. Examples of information that may be stored by the PROM include a serial number, a model number, calibration data, and fluidic data associated with printhead die 40.

Layer 50 may be formed of material (e.g., a photoimagable polymer such as SU8) that is not fluid impermeable and/or has thermal or electrical properties that could potentially interfere with the desired operation of fuses 70. Ink or other fluidic or non-fluidic materials may short blown fuses 70 if allowed to come into contact with blown fuses 70. In addition, fuses may not blow properly if covered by material with undesired thermal or electrical properties. To avoid these potential problems, layer 50 forms a chamber 84 over and adjacent to each fuse 70 and chamber 84 is hermetically sealed by an encapsulation layer 78. Chamber 84 provides thermal and electrical properties that are conducive to blowing fuse 70, and encapsulation layer 78 provides a fluid impermeable layer over layer 50 to prevent ink or other fluidic or non-fluidic materials from coming into contact with fuse 70.

In the embodiment of FIGS. 4A and 4B, layer 50 includes a primer layer 72, a chamber layer 74, and an orifice layer 76. Chamber layer 74 forms chamber 84. A cross-section of chamber 84 is shown along a view AA in FIG. 4B. Primer layer 72 forms a void 82 between a bottom surface 50*b* of layer 50 and chamber 84. Bottom surface 50*b* is adjacent to thin film layer 48 on substrate 40 and is opposite top surface 50*a* of layer 50. Orifice layer 76 forms a single orifice 86 between top surface 50*a* and chamber 84. Orifice 86 provides an access point for removing material from layer 50 to define chamber 84 during a manufacturing process as will be described in additional detail below.

Encapsulation layer 78 is applied to surface 50*a* of layer 50 (i.e., the top surface of orifice layer 76) to enclose chamber 84 by encompassing the portion of surface 50*a* that includes orifice 86. Air pressure in chamber 84 provides resistance against the applied encapsulation material of encapsulation layer 78 to prevent the encapsulation material from wicking too far into orifice 86. In addition, orifice layer 76 forms orifice 86 with a size that is small enough to prevent the encapsulation material from wicking too far into orifice 86. As a result, the encapsulation material extends partially into orifice 86 when applied and forms an edge 90 in orifice 86 as will be described in additional detail below.

In other embodiments, primer layer 72 and void 82 may be omitted so that chamber 84 is formed entirely adjacent to thin film layer 48. In addition, layer 50 may include other numbers of sub-layers for forming chamber 84 and/or orifice 86 in other embodiments.

In the embodiment of FIGS. 4A and 4B, layer 50 defines orifice 86 such that orifice 86 is offset from fuse 70 in a direction that is parallel to a plane that includes surface 50*a* or 50*b*. Layer 50 also defines void 82 such that void 82 is positioned adjacent to fuse 70 and is offset from orifice 86 in a direction that is parallel to a plane that includes surface 50*a* or 50*b*. Orifice 86 and void 82 are offset such that the cross-sections of orifice 86 and void 82 would not overlap if formed in the same plane as shown by the relative positions of orifice 86 and void 82, indicated by dashed lines, in a view AA in FIG. 4B.

In other embodiments, layer 50 may define orifice 86 to be only partially offset from or above from fuse 70 and/or void 82 provided that chamber 84 includes a size sufficient to provide enough air pressure to prevent the applied encapsulation material from encroaching too far into orifice 86 and/or chamber 84.

In the embodiment of FIGS. 4A and 4B, layer 50 defines chamber 84 to include sub-chambers 84A, 84B, and 84C. Sub-chambers 84A and 84B have substantially square and equally sized cross-sections and sub-chamber 84C has a substantially square cross-section that is smaller than the cross-sections of sub-chambers 84A and 84B as shown in FIG. 4B. In one embodiment, the sides of the cross-sections of sub-chambers 84A and 84B may each be 16 μm the sides of the cross-section of sub-chamber 84C may each be 8 μm, the diameter of the cross-section of orifice 86 may be 12 μm, and the sides of the cross-section of void 82 may each be 8 μm. In other embodiments, the cross-sections of sub-chambers 84A, 84B, and 84C, orifice 86, and void 82 may have other shapes and/or dimensions.

Layer 50 defines sub-chamber 84A adjacent to void 82 and fuse 70, sub-chamber 84B adjacent to orifice 86, and sub-chamber 84C between sub-chambers 84A and 84B. Sub-chamber 84C is narrower than sub-chambers 84A and 84B. Narrower regions 88A and 88B of sub-chamber 84C, shown in FIG. 4B, form pinch points on opposing sides of sub-chamber 84C. Dashed lines 89A and 89B in FIG. 4A show the cross-section of the pinch points in chamber 84. If any encapsulation material reaches sub-chamber 84C, the pinch points cause the surface tension of the encapsulation material to form a meniscus that serves to minimize the wicking of the encapsulation material into sub-chamber 84C.

Figure 5:
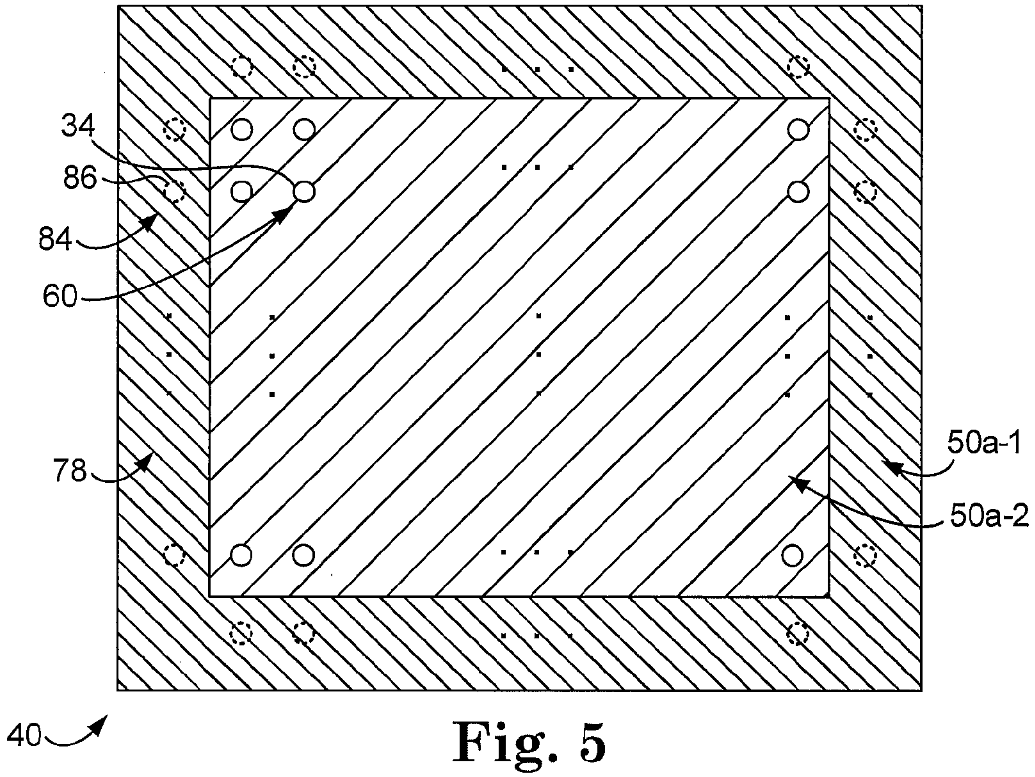
FIG. 5 is a diagram illustrating a top view of one embodiment of a printhead die with fuse orifices and ink nozzles.

Encapsulation layer 78 is formed adjacent to surface 50*a* and encompasses the portion of surface 50*a* that includes orifice 86. When applied, encapsulation material may wick into at least orifice 86 as indicated by edge 90. The encapsulation material bonds printhead die 40 to printhead assembly 22 and encloses the bond pads (not shown) to prevent ink from contacting the bond pads. The encapsulation material may be any suitable viscous adhesive material that is cured to form a solid encapsulation layer 78. FIG. 5 is a diagram illustrating a top view of one embodiment of printhead die 40 with fuse orifices 86 and ink nozzles 34. Fuse chambers 84 with respective fuse orifices 86 are arranged in any suitable arrangement near the perimeter of printhead die 40. Drop generators 60 are arranged in any suitable arrangement away from the perimeter of printhead die 40. Encapsulation layer 78 covers a portion 50*a*-1 of surface 50*a* to encompass all fuse orifices 86 as indicated by the dashed circles which represent fuse orifices 86. Encapsulation layer 78 does not extend into a portion 50*a*-2 of surface 50*a* so that encapsulation layer 78 does not block or cover ink nozzles 34. One or more additional layers of material may be applied on portion 50*a*-2 to increase the fluid impermeability of the top surface of printhead die 40.

In the above embodiments, other components may be formed on substrate 40 in place of fuses 70.

Figure 6:
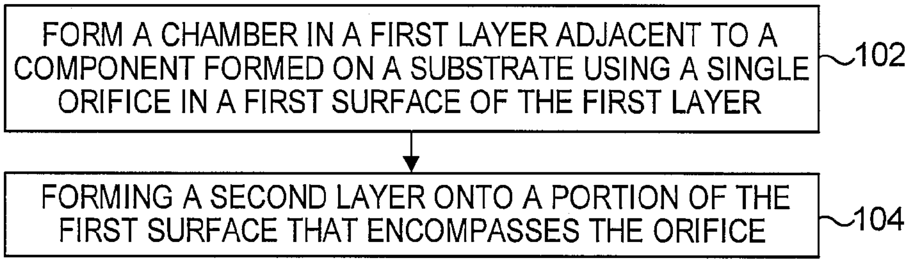
FIG. 6 is a flow chart illustrating an embodiment of a method for forming fuse chambers in a printhead die.
Figure 7A:
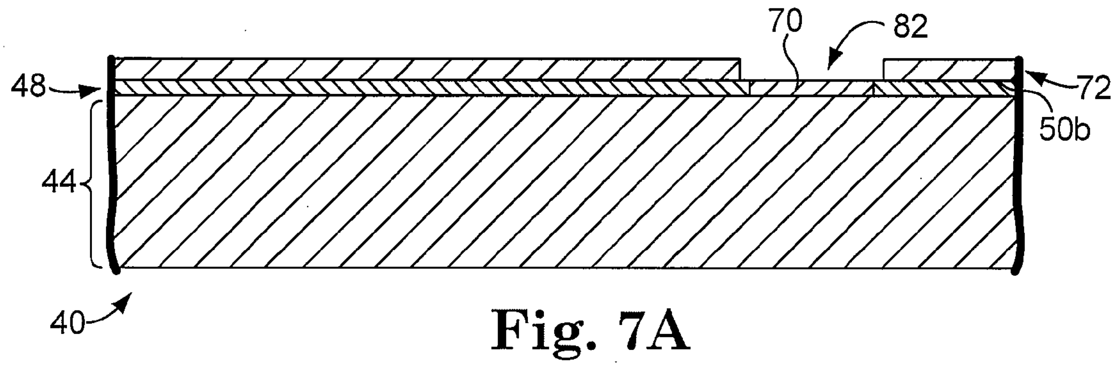
FIGS. 7A-7C are diagrams illustrating an embodiment of the manufacture of fuse chambers in a printhead die.
Figure 7B:
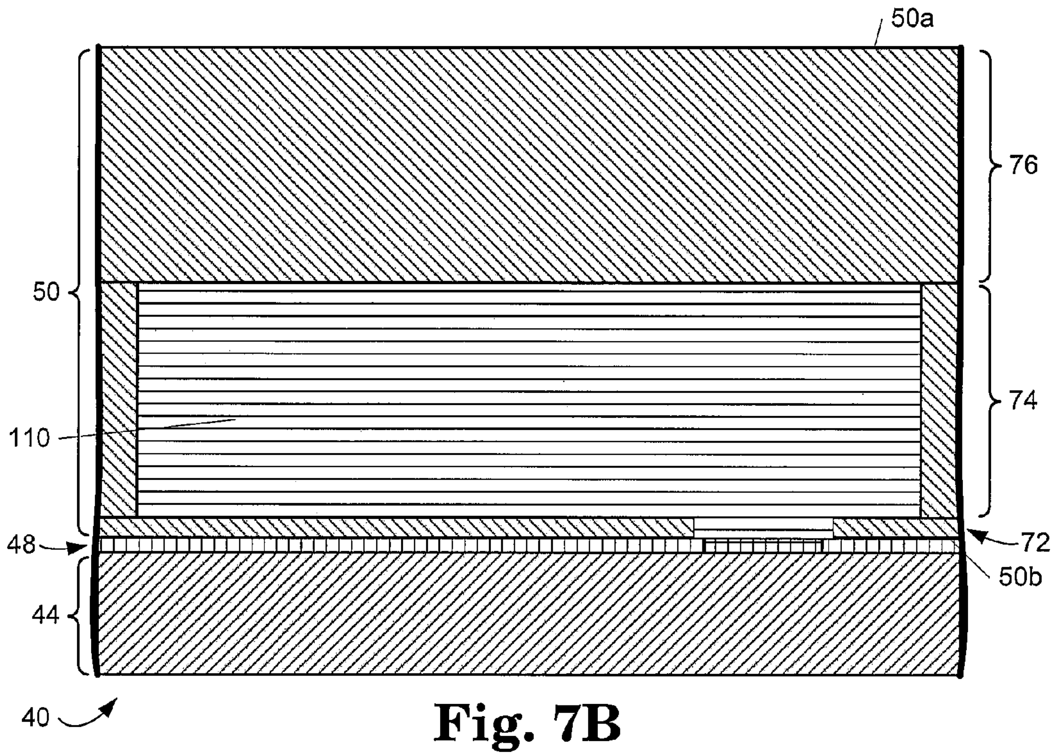
Figure 7C:
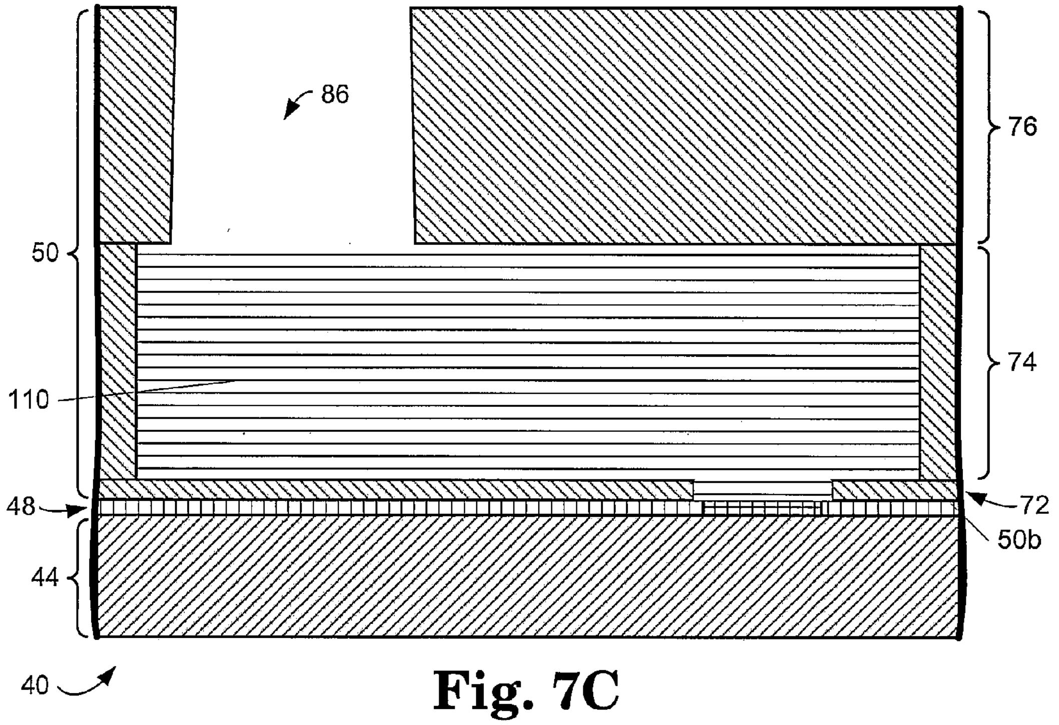

FIG. 6 is a flow chart illustrating an embodiment of a method for forming fuse chambers 84 in a printhead die 40. The embodiment of FIG. 6 will be described with reference to FIGS. 4A-4B and FIGS. 7A-7C. FIGS. 7A-7C are diagrams illustrating an embodiment of the manufacture of fuse chambers 84 in a printhead die 40.

In the embodiment of FIG. 6, chamber 84 is formed in a first layer of material 50 adjacent to a component (e.g., fuse 70) formed on substrate 40 using single orifice 86 in a first surface 50*a* of layer 50 that is opposite a second surface 50*b* of layer 50 adjacent to the substrate as indicated in a block 102.

In one embodiment, chamber 84 may be formed using the lost wax method described in U.S. Pat. No. 7,226,149, which is herein incorporated by reference. In this embodiment, primer layer 72 (e.g., a negative photoresist such as SU8), when present, may be applied over thin film layer 48 (e.g., by spinning) and patterned to remove void 82 as shown in FIG. 7A. Primer layer 72 is patterned by exposing, post exposure baking, developing, and thermal curing primer layer 72 in one embodiment.

Chamber layer 74 (e.g., a negative photoresist such as SU8) is applied over primer layer 72 and/or thin film layer 48 (e.g., by spinning) and patterned to remove chamber 84 and void 82 as shown in FIG. 7B. Chamber layer 74 is patterned by exposing, post exposure baking, developing, and thermal curing chamber layer 74 in one embodiment. Chamber layer 74 also includes narrowed regions to form the pinch points in sub-chamber 84C described above.

A layer of filler material 110 (e.g., a novolac resin or a photoresist that includes novolac resin such as SPR220) is applied over chamber layer 74, primer layer 72 (if present), and thin film layer 48 as shown in FIG. 7B. Filler material 110 is filled into the cavity created by chamber 84 and void 82 and then planarized to be flush with the top of chamber 84 using resist etch back, CMP, or other suitable planarization techniques.

Orifice layer 76 (e.g., a negative photoresist such as SU8) is applied over chamber layer 74 and filler material 110 (e.g., by laminating a dry film of SU8) and patterned to remove orifice 86, chamber 84 and void 82 as shown in FIG. 7C. Orifice layer 76 is patterned by exposing, post exposure baking, developing, and thermal curing orifice layer 76 in one embodiment. In the process of patterning orifice layer 76, a portion of orifice layer 76 over filler structure 110 is removed to form orifice 86 as shown in FIG. 7C. Orifice 86 may be formed offset from (i.e., not directly over) fuse 70 as shown in FIG. 7C and described above to provide additional distance between orifice 86 and fuse 70. Filler material 110 is also removed in by the developer in the patterning of orifice layer 76 to form chamber 84 and void 82 as shown in FIG. 4A.

Referring back to FIG. 6, a second layer of material 78 is formed onto portion 50*a*-1 (shown in FIG. 5) of the first surface 50*a* of layer 50 that encompasses orifice 86 subsequent to forming chamber 84. Viscous encapsulation material is dispensed onto surface 50*a* to cover orifice 86 and bond layer 50 to substrate 40. Air pressure in chamber 84 provides resistance against the applied encapsulation material to prevent the encapsulation material from wicking too far into orifice 86. The pinch points in chamber 84 prevent the encapsulation material from wicking into sub-chamber 84A if any encapsulation material reaches sub-chamber 84C. Encapsulation layer 78 hermetically seals chamber 84 to prevent fluidic and non-fluidic material from entering chamber 84 through orifice 86.

With the above embodiments, a chamber may be formed over each fuse on a substrate using a single orifice to remove material in the chamber layer. The orifice may be covered with encapsulation material without the encapsulation material contacting the fuse using the air present in the chamber. Pinch points may be formed in the chamber to further ensure that the encapsulation material does not contact the fuse. In addition, the amount of material to be removed to form the chamber may be minimized by including a single fuse in each chamber. The chamber may provide a suitable thermal and electrical environment for fuses to be blow while preventing exposure of undesired materials to a blown fuse region.

Although specific embodiments have been illustrated and described herein for purposes of description of the embodiments, it will be appreciated by those of ordinary skill in the art that a wide variety of alternate and/or equivalent implementations may be substituted for the specific embodiments shown and described without departing from the scope of the present disclosure. Those with skill in the art will readily appreciate that the present disclosure may be implemented in a very wide variety of embodiments. This application is intended to cover any adaptations or variations of the disclosed embodiments discussed herein. Therefore, it is manifestly intended that the scope of the present disclosure be limited by the claims and the equivalents thereof.

What is claimed is:

1. A system comprising:

a first layer of material in which a chamber is formed over and adjacent to a component formed on a substrate and a single orifice between the chamber and a first surface of the first layer that is opposite a second surface of the first layer adjacent to the substrate; and an encapsulation layer of encapsulation material enclosing and sealing the chamber on at least a portion of the first surface that encompasses the single orifice, the chamber including a first sub-chamber adjacent to the component, a second sub-chamber adjacent to the single orifice, and a third sub-chamber disposed between and connecting the first sub-chamber and the second sub-chamber, wherein the third sub-chamber is narrower than the first sub-chamber and the second sub-chamber to prevent the encapsulation material from covering all of the component.

2. The system of claim 1 wherein the component is a programmable fuse.

3. The system of claim 1 wherein the encapsulation layer extends at least partially into the single orifice and forms an edge in the single orifice.

4. The system of claim 1 wherein the single orifice is offset from the component in a direction that is parallel to a plane that includes the portion of the first layer.

5. The system of claim 1 wherein the first sub-chamber adjacent to the component is offset from the second sub-chamber in a direction that is parallel to a plane that includes the portion of the first surface.

6. The system of claim 1 wherein a void is formed in the first layer adjacent to the component.

7. An apparatus comprising:

a first layer of material that defines a chamber formed over and adjacent to a component formed on a substrate and a single orifice between the chamber and a first surface of the first layer that is opposite a second surface of the first layer adjacent to the substrate, wherein the first layer includes a primer layer adjacent to the substrate and having the chamber formed over the primer layer and a void formed in the primer layer over the component between the substrate and the chamber; and an encapsulation layer of encapsulation material on at least a portion of the first surface that encompasses and seals the single orifice and partially fills the single orifice and forms an edge in the single orifice to leave at least part of the component uncovered by the encapsulation material.

8. The apparatus of claim 7 wherein the component is a programmable fuse.

9. The apparatus of claim 7 wherein the first layer is a photoimageable polymer.

10. The apparatus of claim 7 wherein the encapsulation layer hermetically seals the single orifice.

11. The apparatus of claim 7 wherein the orifice is offset from the component in a direction that is parallel to a plane that includes the portion of the first surface.

12. The apparatus of claim 7 wherein the chamber includes a first sub-chamber adjacent to the single orifice and a second sub-chamber separate from the first sub-chamber and adjacent to the component and offset from the first sub-chamber in a direction that is parallel to a plane that includes the portion of the first surface.

13. The apparatus of claim 12 wherein the chamber includes a third sub-chamber separate from the first and second sub-chambers and disposed between and connecting the first and the second sub-chambers, and wherein the third sub-chamber is narrower than at least the first sub-chamber.

14. An apparatus comprising:

a first layer of material that defines a chamber formed over and adjacent to a component formed on a substrate and a single orifice between the chamber and a first surface of the first layer that is opposite a second surface of the first layer adjacent to the substrate, the first layer of material is a photoimageable polymer; and an encapsulation layer of encapsulation material on at least a portion of the first surface that encompasses and seals the single orifice.

15. The apparatus of claim 14 wherein the chamber includes a first sub-chamber over the component and a pinch-point between the single orifice and the first sub-chamber to prevent the encapsulation material from covering all of the component.

16. The apparatus of claim 14 wherein the encapsulation material partially fills the single orifice and forms an edge in the single orifice to leave at least part of the component uncovered by the encapsulation material.

17. The apparatus of claim 14 wherein the single orifice is offset from the component in a direction that is parallel to a plane that includes the portion of the first layer.

18. The apparatus of claim 14 wherein the chamber includes a first sub-chamber adjacent to the single orifice and a second sub-chamber separate from the first sub-chamber and adjacent to the component and offset from the first sub-chamber in a direction that is parallel to a plane that includes the portion of the first surface.

* * * * *